United States Patent [19]

Malhi et al.

[11] Patent Number: 5,457,068
[45] Date of Patent: Oct. 10, 1995

[54] MONOLITHIC INTEGRATION OF MICROWAVE SILICON DEVICES AND LOW LOSS TRANSMISSION LINES

[75] Inventors: Satwinder Malhi, Garland; Chi-Cheong Shen, Richardson; Oh-Kyong Kwon, Plano, all of Tex.

[73] Assignee: Texas Instruments Incorporated, Dallas, Tex.

[21] Appl. No.: 985,095

[22] Filed: Nov. 30, 1992

[51] Int. Cl.$^6$ .................................................. H01L 21/44
[52] U.S. Cl. ........................... 437/186; 437/61; 437/72
[58] Field of Search .............................. 437/186, 61, 67, 437/79, 203, 902, 72

[56] References Cited

U.S. PATENT DOCUMENTS

| | | | |
|---|---|---|---|
| 3,500,139 | 3/1970 | Frouin et al. | 437/67 |
| 4,473,598 | 9/1984 | Ephrath et al. | 437/67 |
| 4,635,090 | 1/1987 | Tamaki et al. | . |
| 4,807,022 | 2/1989 | Kazior et al. | 437/203 |
| 4,810,668 | 3/1989 | Ito | 437/72 |
| 5,091,330 | 2/1992 | Cambou et al. | . |

FOREIGN PATENT DOCUMENTS

| | | | |
|---|---|---|---|
| 4088657 | 3/1992 | Japan | 437/72 |

OTHER PUBLICATIONS

P. Sanders "An inexpensive Silicon Monolithic IC process for microwave low and medium power circuits" Proc. R. F. Technology Expo 89 (1989) (Month Unknown) pp. 153–157 (Abstract).

P. Sanders "Silicon Monolithic IC process for microwave circuits" Electron Eng. (London) vol. 61, No. 746 (Feb. 1989). (pages unknown). (Abstract).

*Primary Examiner*—Olik Chaudhuri
*Assistant Examiner*—C. Everhart
*Attorney, Agent, or Firm*—Carlton H. Hoel; W. James Brady, III; Richard L. Donaldson

[57] ABSTRACT

A monolithic integrated circuit capable of operation in the microwave range which is fabricated using silicon technology wherein transmission line interconnects are fabricated along with active devices on the same substrate. The transmission line is provided using polycrystalline silicon since it can have much higher resistivity than single crystal silicon. Accordingly, a circuit is provided wherein active devices are provided in single crystal silicon and interconnects are formed overlying polycrystalline silicon to provide transmission line interconnects between devices and obtain the desired high frequency response. This is accomplished by providing a highly doped silicon substrate of predetermined conductivity type having a less highly doped silicon layer thereon of the same conductivity type with an oxide layer over the less highly doped layer, forming mesas for formation therein of active elements in the structure having valleys between the mesas extending into the substrate, filling the valleys with very high resistivity polysilicon, forming an electrically insulating layer over the polysilicon, forming active elements with contacts thereto in the mesas and forming interconnects between contacts of the active elements extending over the high resistivity polysilicon regions and the electrically insulating material thereover.

18 Claims, 3 Drawing Sheets

MONOLITHIC INTEGRATION OF MICROWAVE SILICON DEVICES AND LOW LOSS TRANSMISSION LINES

BACKGROUND OF THE INVENTION

1. Field of the Invention

This invention relates to integrated circuits capable of operation in the microwave range and, more specifically, to such integrated circuits fabricated in silicon technology and methods of fabrication thereof.

2. Brief Description of the Prior Art

Integrated circuits capable of operation in the microwave range are finding increasing use, primarily in consumer and commercial applications, such as, for example, mobile communication. Prior art integrated circuits capable of operation in the microwave range have generally been fabricated using gallium arsenide substrates and possibly other group III–V semiconductor technologies. Gallium arsenide substrates have been generally preferred because of their intrinsic device performance, good isolation properties between devices at microwave frequencies due to the high resistivity of intrinsic GaAs substrates and the low loss transmission line interconnects formed as a result of the low dielectric loss of high resistivity GaAs substrates.

Particular problems associated with group III–V substrates and particularly gallium arsenide substrates are their high starting cost, the low yields obtained compared with silicon technology. The result is that semiconductor devices such as integrated circuits fabricated in group III–V technologies and particularly gallium arsenide are high cost devices relative to silicon technologies.

Furthermore, in order to provide a transmission line interconnect, it is necessary to provide a dielectric of very low loss which must also be relatively thick, for example 50 to 100 micrometers. In group III–V technology, the dielectric has generally been an "air bridge" wherein air is the dielectric or an intrinsic GaAs substrate which has very high resistivity relative to silicon.

SUMMARY OF THE INVENTION

In accordance with the present invention, there is provided a monolithic integrated circuit capable of operation in the microwave range of about 2 to 4 gigahertz which is fabricated using silicon technology wherein transmission line interconnects are fabricated along with active devices on the same substrate. The integrated circuit fabricated in this manner displays the properties required for use in the microwave range, yet is fabricated at much lower cost than can be obtained using gallium arsenide technology due to the lower cost of the initial starting material as well as the improved yield. The transmission line is provided using polycrystalline silicon since it can have much higher resistivity than single crystal silicon. Accordingly, a circuit is provided wherein active devices are provided in single crystal silicon and interconnects are formed overlying polycrystalline silicon to provide transmission line interconnects between devices and obtain the desired high frequency response.

Briefly, the above is accomplished by providing a highly doped silicon wafer or substrate of predetermined conductivity type having a less highly doped silicon layer thereon of the same conductivity type with an oxide layer thereon. Mesas are formed for formation therein of active elements and valleys between mesas extend into the substrate. The valleys are oxidized and filled with very high resistivity polysilicon, such as, for example, $10^5$ to $10^7$ ohm-centimeters, an electrically insulating layer is formed over the polysilicon and a sinker of the same conductivity type as the substrate is formed through the less highly doped layer. Active elements are formed in the mesa regions surrounded by the polysilicon regions, contacts are formed to the active elements and interconnects between active elements are formed over the high resistivity polysilicon regions and electrically insulating material thereover.

A silicon substrate or ceramic is adhered to the active wafer surface with a removable adhesive, preferably a polyimide and the opposing side of the wafer is removed, preferably by grinding, up to the polysilicon region or the oxide layer thereunder. A further substrate is then adhered to the wafer along the ground surface with an adhesive, preferably a polyimide. The further substrate is a good heat sink which is either electrically conductive or electrically insulating. When the further substrate is electrically insulating, a ground plane is formed on the surface thereof remote from the wafer. The further substrate is preferably copper if an electrical conductor is desired and aluminum nitride when an electrical insulator is desired.

DESCRIPTION OF THE PREFERRED EMBODIMENT

Figure 1:
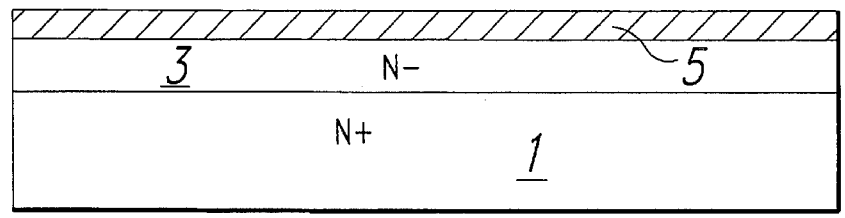
FIGS. 1 to 11 are a process flow to obtain an integrated circuit in accordance with the present invention.

Referring now to FIGS. 1 to 11, there is provided a process flow for fabrication of a monolithic integrated circuit in accordance with the present invention. As shown in FIG. 1, there is provided a silicon n+ wafer 1 which has been arsenic doped to have a resistivity of 0.001 to 0.003 ohm-centimeters. A 4 micron n– layer of silicon 3 is epitaxially deposited over the wafer 1 and the surface of epitaxial layer 3 is oxidized to grow a 0.5 micron layer of silicon oxide 5 thereon.

Figure 2:
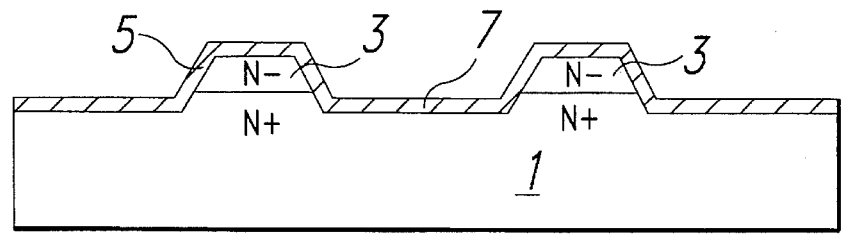

The oxide layer 5 is patterned to provide mesa location and the oxide is etched in the unpatterned areas. The silicon is then etched to a depth of 125 micrometers, extending the mesa with sloping sidewalls into the substrate 1. An oxide layer 7 is then grown over the surface of the exposed silicon 1 and 3 to a thickness of 0.5 microns as shown in FIG. 2. The active devices will later be formed in the mesas.

Figure 3:
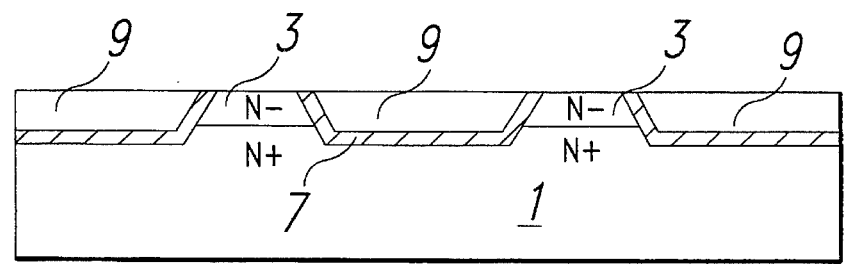
Figure 4:
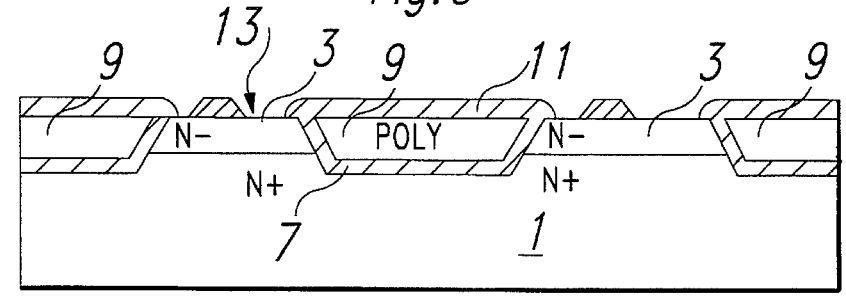

A 150 micrometer thick layer of high resistivity polysilicon 9 is then deposited over the surface of the structure of FIG. 2 and the polysilicon is ground back along with the remaining portion of the oxide layer 5 to provide a substantially planar surface as shown in FIG. 3. A pad oxide layer is grown over the surface of the structure of FIG. 3, and an oxide layer is formed thereover, these layers being patterned and plasma etched to leave a 10,000 Å layer of oxide 11 over the polysilicon 9 and the exposed silicon region 3 at the moat region 13 as shown in FIG. 4. Silicon dioxide of 1000 Å thickness is regrown on the moat area.

Figure 5:
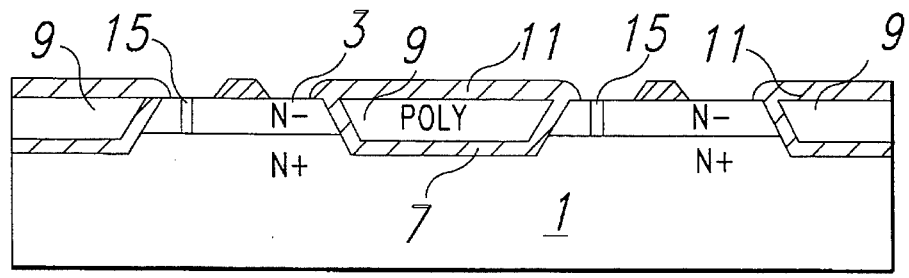
Figure 6:
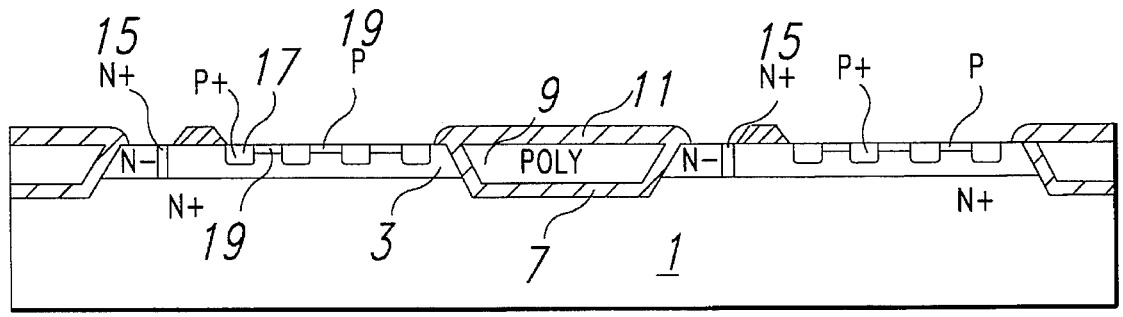

The moat region 13 is then patterned with resist to provide an n+ sinker and phosphorus is implanted into the sinker region 15 through the n– layer 3 to the n+ substrate 1 as shown in FIG. 5. The moat region 13 is again patterned for p+ implants and boron is implanted to form p+ regions 17. This boron is driven into the layer 3 by thermal drive-in method. A second patterning step followed by a second boron implant provides intrinsic base p regions 19 between and in contact with the p+ regions 17. The device is then annealed in standard manner to provide the structure shown in FIG. 6.

Figure 7:
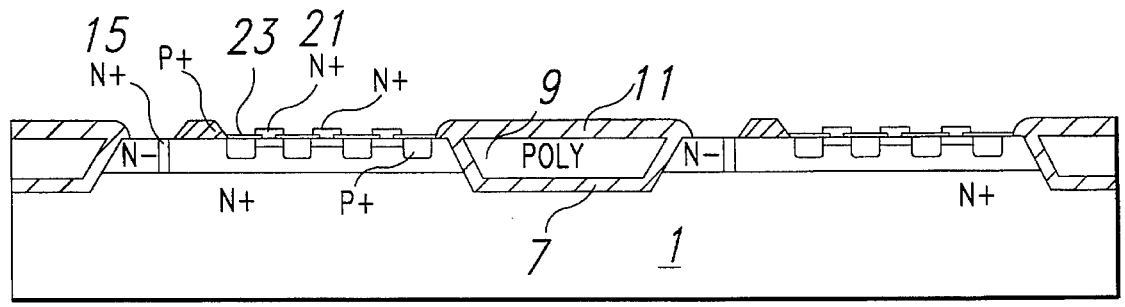
Figure 8:
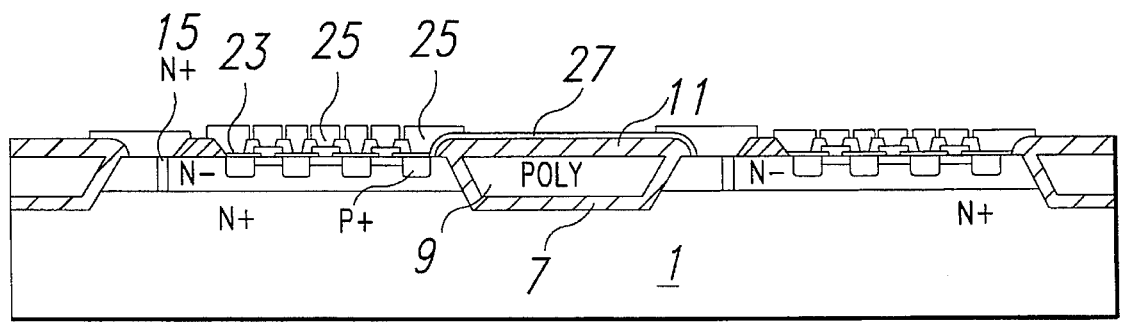

An oxide layer 23 of about 2000 Å is then deposited over the moat region and the emitter regions are patterned thereon to be formed within the base regions 19. The oxide layer 23 is etched at the emitter regions and a 0.3 to 0.5 micrometer polysilicon layer is deposited and arsenic is implanted thereinto. The polysilicon layer is patterned, etched and thermally treated to form n+ emitters 21 as shown in FIG. 7. Contacts 25 are formed in standard manner to each of the emitter regions 21, base regions 17 and N+ sinkers 15 and interconnects 27 between devices are formed over the polysilicon 9 and oxide layer 11 thereover in standard manner as shown in FIG. 8. A wafer of silicon 29 is then adhered to the active surface of the structure of FIG. 8 by means of a removable adhesive, preferably a polyimide 31, and the wafer portion 1 is ground back either through or to the oxide layer 7 to the polysilicon region 9 as shown in FIG. 9.

Figure 9:
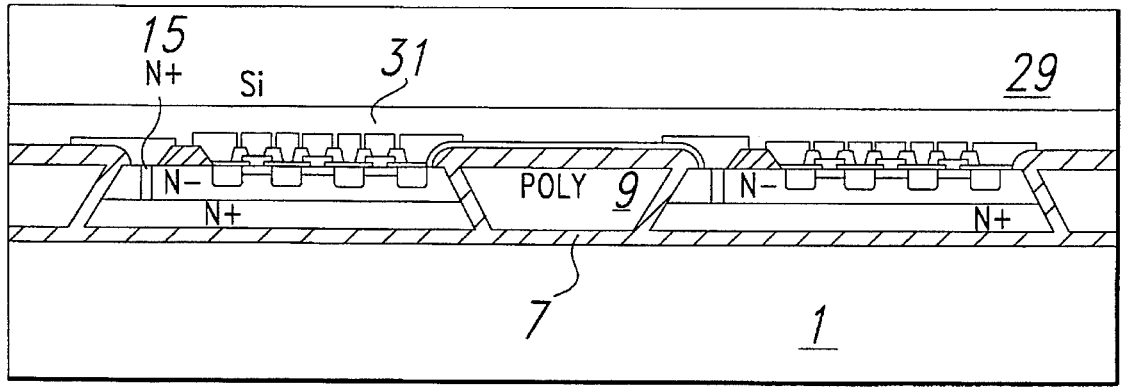
Figure 10:
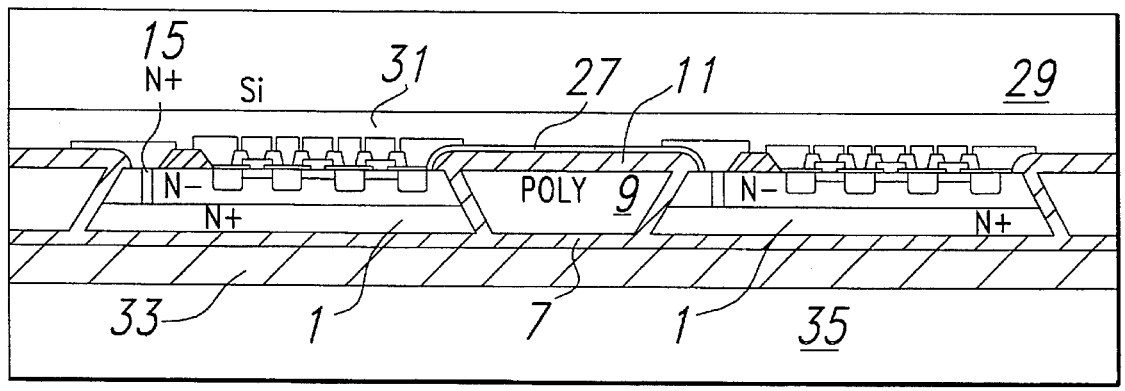

A further permanent epoxy adhesive 33 then secures a further highly thermally conductive substrate 35 (e.g. copper for an electrically conductive region or AlN for a dielectric region) to the ground back side of the structure of FIG. 9 as shown in FIG. 10. The substrate 29 and adhesive 31 are now removed by removing the temporary adhesive 31 by wet etching in a solvent to provide the structure as shown in FIG. 11.

Figure 11:
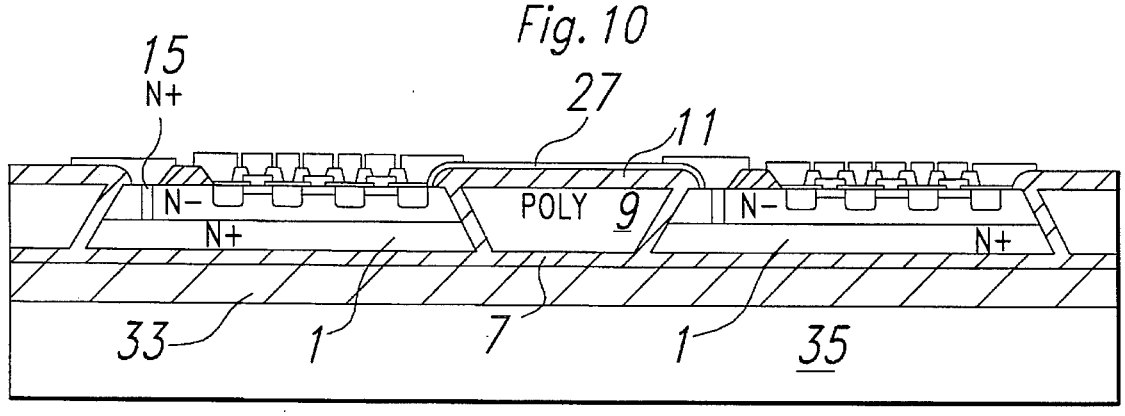

As can be seen in FIG. 11, there is provided a structure having interconnects 27 disposed over polysilicon 9 having resistivity in the $10^5$ to $10^7$ ohm-centimeter range. When the device is attached to a substrate which is a dielectric of very high quality (e.g. AlN substrate 35), there is a good microwave interconnect. Then a metal layer is provided as the back of the dielectric substrate 35 to provide a ground plane. When the substrate 35 is an electrical conductor, preferably copper, the substrate can be used as the ground plane for the transmission lines. Accordingly, the active device are formed in single crystal silicon and the interconnects are disposed over polycrystalline silicon with a metal or another dielectric under the structure.

Though the invention has been described with respect to specific preferred embodiments thereof, many variations and modifications will immediately become apparent to those skilled in the art. It is therefore the intention that the appended claims be interpreted as broadly as possible in view of the prior art to include all such variations and modification.

We claim:

1. A method of forming an integrated circuit semiconductor microwave device comprising the steps of:
   (a) providing a highly doped silicon substrate of a first conductivity type having a less highly doped silicon layer thereon of said first conductivity type and having an electrically insulating layer over said less highly doped layer;
   (b) forming mesas for formation therein of active elements in the structure of step (a) having valleys between said mesas, said valleys extending from said electrically insulating layer into said highly doped substrate;
   (c) filling said valleys with polysilicon having very high resistivity relative to the resistivity of said substrate;
   (d) forming an electrically insulating layer over said polysilicon;
   (e) forming active elements with contacts thereto on said mesas; and
   (f) forming interconnects between contacts of said active elements in adjacent ones of said mesas, said interconnects extending over said very high resistivity polysilicon regions and said electrically insulating layer thereover.

2. A method of forming an integrated circuit semiconductor microwave device comprising the steps of:
   (a) providing a highly doped silicon substrate of predetermined conductivity type having a less highly doped silicon layer thereon of said predetermined conductivity type and having an electrically insulating layer over said less highly doped layer;
   (b) forming mesas for formation therein of active elements in the structure of step (a) having valleys between said mesas, said valleys extending from said electrically insulating layer into said highly doped substrate;
   (c) filling said valleys with polysilicon having very high resistivity relative to the resistivity of said substrate;
   (d) forming an electrically insulating layer over said polysilicon;
   (e) forming active elements with contacts thereto on said mesas; and
   (f) forming interconnects between contacts of said active elements in adjacent ones of said mesas, said interconnects extending over said very high resistivity polysilicon regions and said electrically insulating layer thereover; and
   (g) removing the portion of said substrate on a side thereof opposed to the side thereof containing said mesas and said valleys up to said valleys and placing a heat sink on said substrate on said side thereof opposed to the side thereof containing said mesas and said valleys.

3. The method of claim 2 wherein said heat sink is an electrical conductor.

4. The method of claim 2 wherein said heat sink is an electrical insulator.

5. The method of claim 4 further including the step of forming a ground plane on said heat sink.

6. The method of claim 2 further including the step of removably adhering a layer of material over said side including said mesas and said valleys prior to said step of removing a portion of said substrate and then removing said layer of material after said steps of removing said portion of said substrate and placing said heat sink on said substrate.

7. The method of claim 3 further including the step of removably adhering a layer of material over said side including said mesas and said valleys prior to said step of removing a portion of said substrate and then removing said layer of material after said steps of removing said portion of said substrate and placing said heat sink on said substrate.

8. The method of claim 4 further including the step of removably adhering a layer of material over said side including said mesas and said valleys prior to said step of removing a portion of said substrate and then removing said layer of material after said steps of removing said portion of said substrate and placing said heat sink on said substrate.

9. The method of claim 5 further including the step of removably adhering a layer of material over said side including said mesas and said valleys prior to said step of removing a portion of said substrate and then removing said layer of material after said steps of removing said portion of said substrate and placing said heat sink on said substrate.

10. A method of forming an integrated circuit semiconductor microwave device comprising the steps of:
    (a) providing a highly doped silicon substrate of predetermined conductivity type having a less highly doped silicon layer thereon of said predetermined conductivity type and having an electrically insulating layer over said less highly doped layer;

(b) forming mesas for formation therein of active elements in the structure of step (a) having valleys between said mesas, said valleys extending from said electrically insulating layer into said highly doped substrate;

(c) filling said valleys with polysilicon having very high resistivity relative to the resistivity of said substrate;

(d) forming an electrically insulating layer over said polysilicon;

(e) forming active elements with contacts thereto on said mesas; and (f) forming interconnects between contacts of said active elements in adjacent ones of said mesas, said interconnects extending over said very high resistivity polysilicon regions and said electrically insulating layer thereover; and (g) wherein said very high resistivity polysilicon is from about $10^5$ to about $10^7$ ohm-centimeters.

11. The method of claim 3 wherein said very high resistivity polysilicon is from about $10^5$ to about $10^7$ ohm-centimeters.

12. The method of claim 5 wherein said very high resistivity polysilicon is from about $10^5$ to about $10^7$ ohm-centimeters.

13. A method of forming an integrated circuit semiconductor microwave device comprising the steps of:

(a) providing a highly doped silicon substrate of predetermined conductivity type having a less highly doped silicon layer thereon of said predetermined conductivity type and having an electrically insulating layer over said less highly doped layer;

(b) forming mesas for formation therein of active elements in the structure of step (a) having valleys between said mesas, said valleys extending from said electrically insulating layer into said highly doped substrate;

(c) filling said valleys with polysilicon having very high resistivity relative to the resistivity of said substrate;

(d) forming an electrically insulating layer over said polysilicon;

(e) forming active elements with contacts thereto on said mesas; and (f) forming interconnects between contacts of said active elements in adjacent ones of said mesas, said interconnects extending over said very high resistivity polysilicon regions and said electrically insulating layer thereover; and (g) wherein said highly doped silicon substrate has a resistivity from about 0.001 to about 0.003 ohm-centimeters.

14. The method of claim 3 wherein said highly doped silicon substrate has a resistivity from about 0.001 to about 0.003 ohm-centimeters.

15. The method of claim 5 wherein said highly doped silicon substrate has a resistivity from about 0.001 to about 0.003 ohm-centimeters.

16. The method of claim 10 wherein said highly doped silicon substrate has a resistivity from about 0.001 to about 0.003 ohm-centimeters.

17. The method of claim 11 wherein said highly doped silicon substrate has a resistivity from about 0.001 to about 0.003 ohm-centimeters.

18. The method of claim 12 wherein said highly doped silicon substrate has a resistivity from about 0.001 to about 0.003 ohm-centimeters.

* * * * *